(12) United States Patent
Ozaki et al.

(10) Patent No.: US 12,369,345 B2
(45) Date of Patent: Jul. 22, 2025

(54) COMPOUND SEMICONDUCTOR DEVICE, AMPLIFIER, AND METHOD FOR MANUFACTURING COMPOUND SEMICONDUCTOR DEVICE

(71) Applicant: FUJITSU LIMITED, Kawasaki (JP)

(72) Inventors: Shirou Ozaki, Yamato (JP); Junji Kotani, Atsugi (JP); Toshihiro Ohki, Hadano (JP); Naoya Okamoto, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 728 days.

(21) Appl. No.: 17/728,389

(22) Filed: Apr. 25, 2022

(65) Prior Publication Data
US 2023/0037148 A1    Feb. 2, 2023

(30) Foreign Application Priority Data
Aug. 2, 2021   (JP) .................. 2021-126429

(51) Int. Cl.
| | |
|---|---|
| H10D 30/47 | (2025.01) |
| H01L 21/02 | (2006.01) |
| H03F 1/32 | (2006.01) |
| H03F 3/213 | (2006.01) |
| H10D 30/01 | (2025.01) |
| H10D 62/824 | (2025.01) |

(52) U.S. Cl.
CPC ..... H10D 30/475 (2025.01); H01L 21/02241 (2013.01); H03F 1/3241 (2013.01); H03F 3/213 (2013.01); H10D 30/015 (2025.01); H10D 30/472 (2025.01); H10D 62/824 (2025.01)

(58) Field of Classification Search
None
See application file for complete search history.

(56) References Cited

U.S. PATENT DOCUMENTS

| | | |
|---|---|---|
| 7,678,629 B1 | 3/2010 | Mason et al. |
| 2006/0049427 A1 | 3/2006 | Takahashi |

FOREIGN PATENT DOCUMENTS

| | | |
|---|---|---|
| JP | 2006-080152 A | 3/2006 |
| JP | 2016-152404 A | 8/2016 |

*Primary Examiner* — Grant S Withers
(74) *Attorney, Agent, or Firm* — ArentFox Schiff LLP

(57) ABSTRACT

A compound semiconductor device includes a carrier supply layer, a channel layer disposed over the carrier supply layer and configured to include InGaAs, and an etching stopper layer disposed over the channel layer, and configured to include a first layer disposed over the channel layer and configured to include $In_{x1}Ga_{1-x1}P$, and a second layer disposed over the first layer and configured to include $In_{x2}Ga_{1-x2}P$, wherein x1 is greater than 0 and less than or equal to 1, x2 is greater than or equal to 0 and less than 1, and x1 is greater than x2.

19 Claims, 25 Drawing Sheets

COMPOUND SEMICONDUCTOR DEVICE, AMPLIFIER, AND METHOD FOR MANUFACTURING COMPOUND SEMICONDUCTOR DEVICE

CROSS-REFERENCE TO RELATED APPLICATION

This application is based upon and claims the benefit of priority of the prior Japanese Patent Application No. 2021-126429, filed on Aug. 2, 2021, the entire contents of which are incorporated herein by reference.

FIELD

The embodiments discussed herein are related to a compound semiconductor device, an amplifier, and a method for manufacturing a compound semiconductor device.

BACKGROUND

The application of an indium phosphide (InP)-based high-electron-mobility transistor (HEMT) to large-capacity high-speed wireless communication in a millimeter-wave band and a terahertz band is expected. The InP-based HEMT has high-speed low-noise device characteristics. To apply the InP-based HEMT to a wireless transmission/reception system in a 300 GHz band, a maximum oscillation frequency (fmax) of 600 GHz or higher is desired for the InP-based HEMT alone. To increase the maximum oscillation frequency, it is effective to reduce a drain conductance (gd) in addition to reducing a parasitic capacitance by shortening a gate length.

To reduce the drain conductance, it is effective to suppress impact ionization by electric field relaxation in a channel. For the electric field relaxation, a structure has been proposed in which a carrier supply layer is located closer to a substrate than a channel layer is. A HEMT having this structure may be referred to as an inverse HEMT.

Japanese Laid-open Patent Publication No. 2016-152404, Japanese Laid-open Patent Publication No. 2006-80152, and U.S. Pat. No. 7,678,629 are disclosed as related art.

SUMMARY

According to an aspect of the embodiments, a compound semiconductor device includes a carrier supply layer, a channel layer disposed over the carrier supply layer and configured to include InGaAs, and an etching stopper layer disposed over the channel layer, and configured to include a first layer disposed over the channel layer and configured to include $In_{x1}Ga_{1-x1}P$, and a second layer disposed over the first layer and configured to include $In_{x2}Ga_{1-x2}P$, wherein x1 is greater than 0 and less than or equal to 1, x2 is greater than or equal to 0 and less than 1, and x1 is greater than x2.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

In an inverse HEMT of the related art, the concentration of a two-dimensional electronic gas (2DEG) decreases because of an influence of an etching stopper that is formed over a channel layer containing indium gallium arsenide (InGaAs) and that contains indium gallium phosphide (InGaP).

Embodiments of a technique capable of suppressing a decrease in concentration of the 2DEG will be specifically described below with reference to the accompanying drawings. In the specification and drawings, redundant description may be omitted by denoting constituent elements having substantially the same functional configuration by using the same reference sign.

First Embodiment

Figure 1:
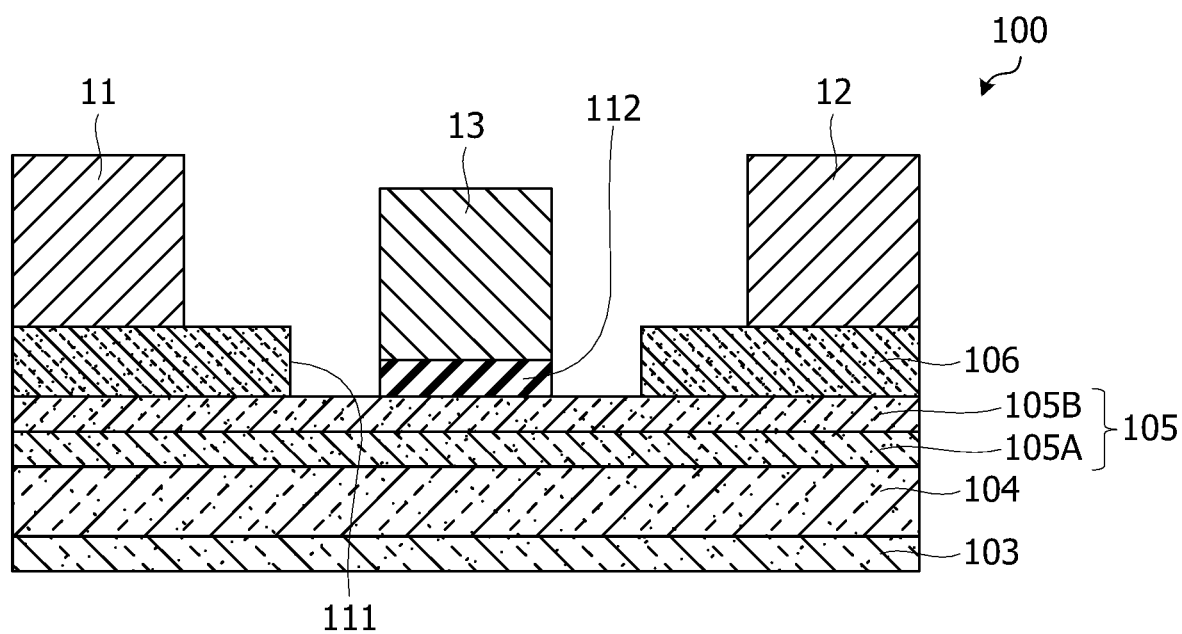
FIG. 1 is a sectional view illustrating a compound semiconductor device according to a first embodiment.

First, a first embodiment will be described. The first embodiment relates to a compound semiconductor device including an InP-based HEMT. FIG. 1 is a sectional view illustrating the compound semiconductor device according to the first embodiment.

As illustrated in FIG. 1, a compound semiconductor device 100 according to the first embodiment includes a carrier supply layer 103, a channel layer 104, an etching stopper layer 105, a cap layer 106, an insulating layer 112, a source electrode 11, a drain electrode 12, and a gate electrode 13.

The channel layer 104 is disposed over the carrier supply layer 103. The channel layer 104 contains InGaAs. The etching stopper layer 105 is disposed over the channel layer 104. The etching stopper layer 105 includes a first layer 105A and a second layer 105B. The first layer 105A is disposed over the channel layer 104. The first layer 105A contains $In_{x1}Ga_{1-x1}P$ (0<x1≤1). The second layer 105B is disposed over the first layer 105A. The second layer 105B contains $In_{x2}Ga_{1-x2}P$ (0≤x2<1). A value of x1 that denotes an In composition of the first layer 105A is greater than a value of x2 that denotes an In composition of the second layer 105B. A difference in lattice constant between the first layer 105A and the channel layer 104 is smaller than a difference in lattice constant between the second layer 105B and the channel layer 104.

The cap layer 106 is disposed over the etching stopper layer 105. The cap layer 106 has a recess 111 that reaches the etching stopper layer 105. The source electrode 11 and the drain electrode 12 are disposed over the cap layer 106 with the recess 111 interposed between the source electrode 11 and the drain electrode 12 in plan view. The insulating layer 112 is disposed over the etching stopper layer 105 inside the recess 111. The gate electrode 13 is disposed over the insulating layer 112.

In the first embodiment, a 2DEG is generated in the vicinity of an interface of the channel layer 104 to the carrier supply layer 103.

Next, a method for manufacturing the compound semiconductor device 100 according to the first embodiment will be described. FIGS. 2 to 6 are sectional views illustrating the method for manufacturing the compound semiconductor device 100 according to the first embodiment.

Figure 2:
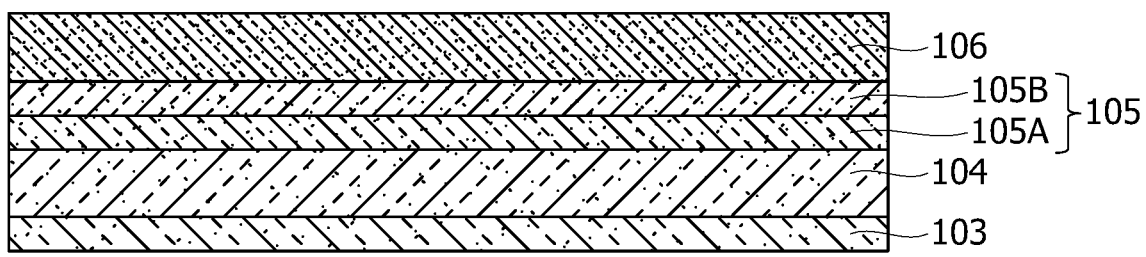
FIG. 2 is a sectional view (part 1) illustrating a method for manufacturing the compound semiconductor device according to the first embodiment.

First, as illustrated in FIG. 2, the channel layer 104 is formed over the carrier supply layer 103. The first layer 105A is formed over the channel layer 104. The second layer 105B is formed over the first layer 105A. The cap layer 106 is formed over the second layer 105B.

Figure 3:
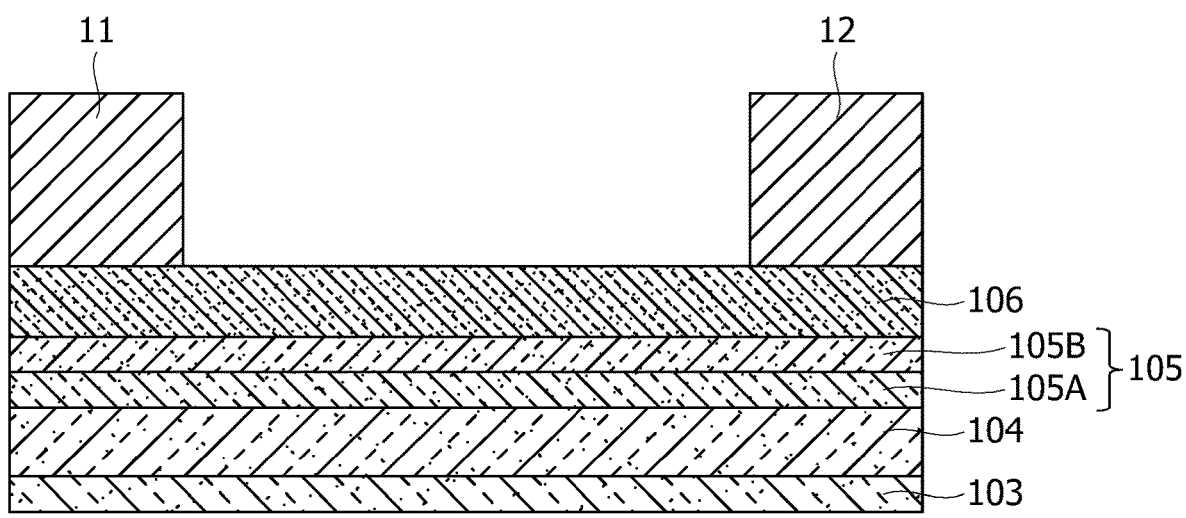
FIG. 3 is a sectional view (part 2) illustrating the method for manufacturing the compound semiconductor device according to the first embodiment.

Next, as illustrated in FIG. 3, the source electrode 11 and the drain electrode 12 are formed over the cap layer 106.

Figure 4:
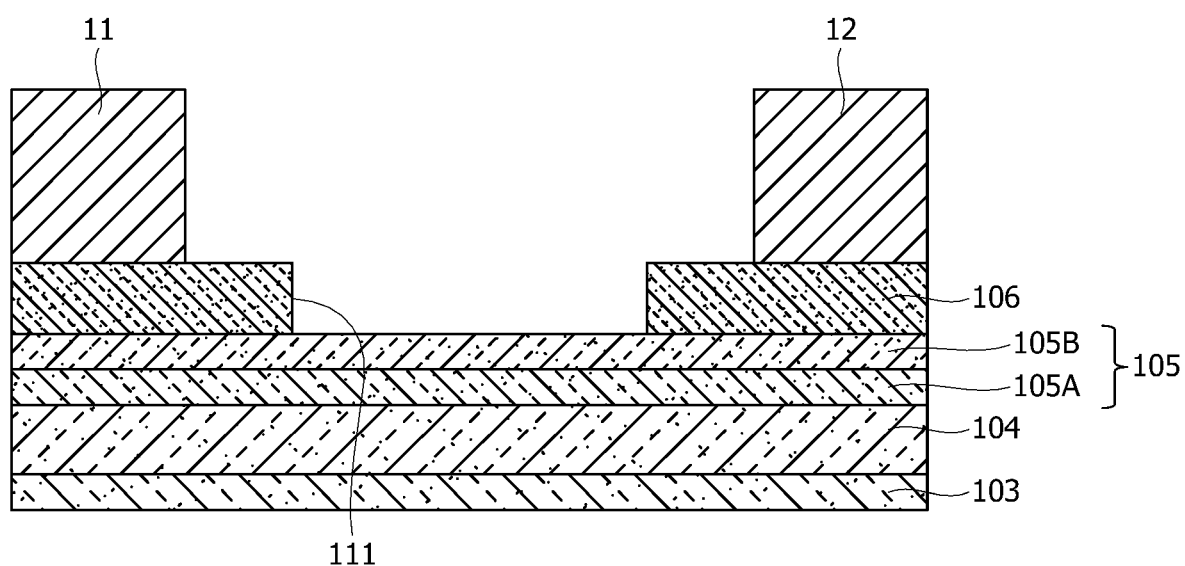
FIG. 4 is a sectional view (part 3) illustrating the method for manufacturing the compound semiconductor device according to the first embodiment.

Thereafter, as illustrated in FIG. 4, the recess 111 for the gate electrode 13 is formed in the cap layer 106 between the source electrode 11 and the drain electrode 12 in plan view. The recess 111 is formed so as to reach the etching stopper layer 105.

Figure 5:
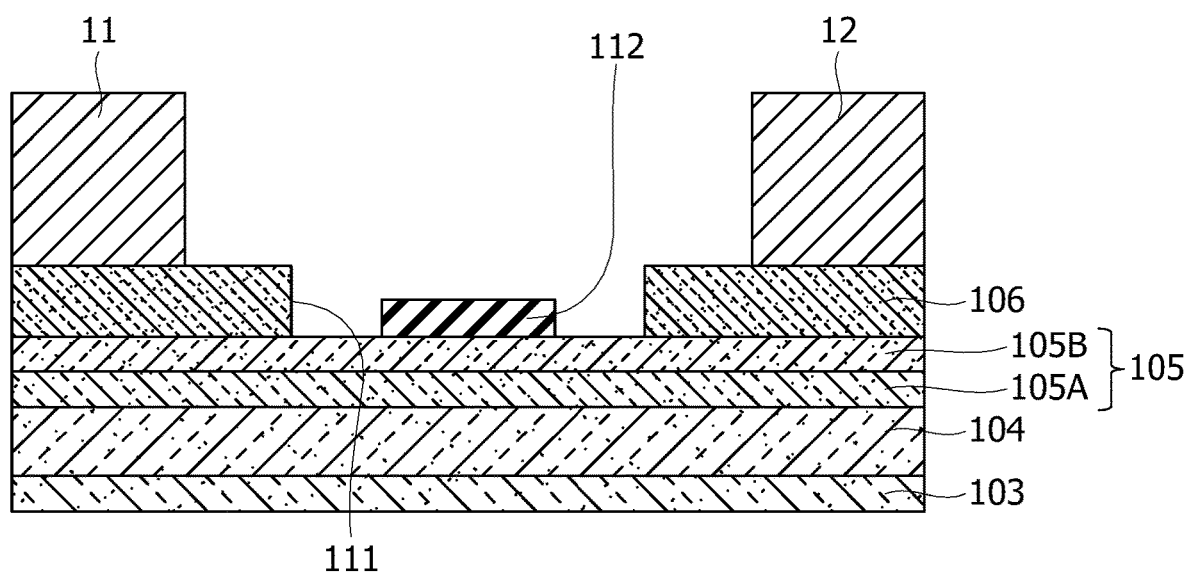
FIG. 5 is a sectional view (part 4) illustrating the method for manufacturing the compound semiconductor device according to the first embodiment.

Subsequently, as illustrated in FIG. 5, the insulating layer 112 is formed over the etching stopper layer 105 inside the recess 111.

Figure 6:
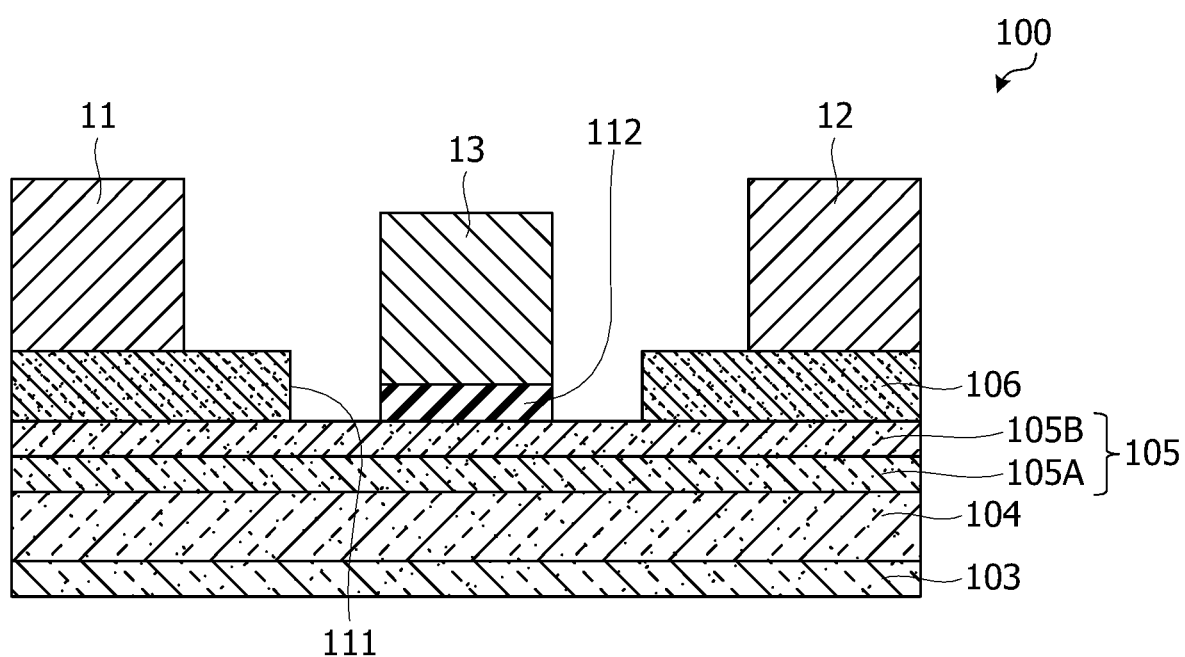
FIG. 6 is a sectional view (part 5) illustrating the method for manufacturing the compound semiconductor device according to the first embodiment.

Next, as illustrated in FIG. 6, the gate electrode 13 is formed over the insulating layer 112.

In the first embodiment, the etching stopper layer 105 includes the first layer 105A and the second layer 105B. The value of x1 that denotes the In composition of the first layer 105A is greater than the value of x2 that denotes the In composition of the second layer 105B, and the difference in lattice constant between the first layer 105A and the channel layer 104 is smaller than the difference in lattice constant between the second layer 105B and the channel layer 104. Therefore, as compared with a case where the etching stopper layer 105 is constituted only by the second layer 105B, a lattice mismatch between the channel layer 104 and the etching stopper layer 105 may be reduced and thus a decrease in concentration of the 2DEG because of the lattice mismatch may be suppressed. As compared with a case where the etching stopper layer 105 is constituted only by the first layer 105A, a larger band gap of the etching stopper layer 105 may be ensured and thus a leakage current may be suppressed.

Since etching of the cap layer 106 for forming the recess 111 may be stopped at an upper surface of the etching stopper layer 105, manufacturing may be performed with a high accuracy.

Second Embodiment

Figure 7:
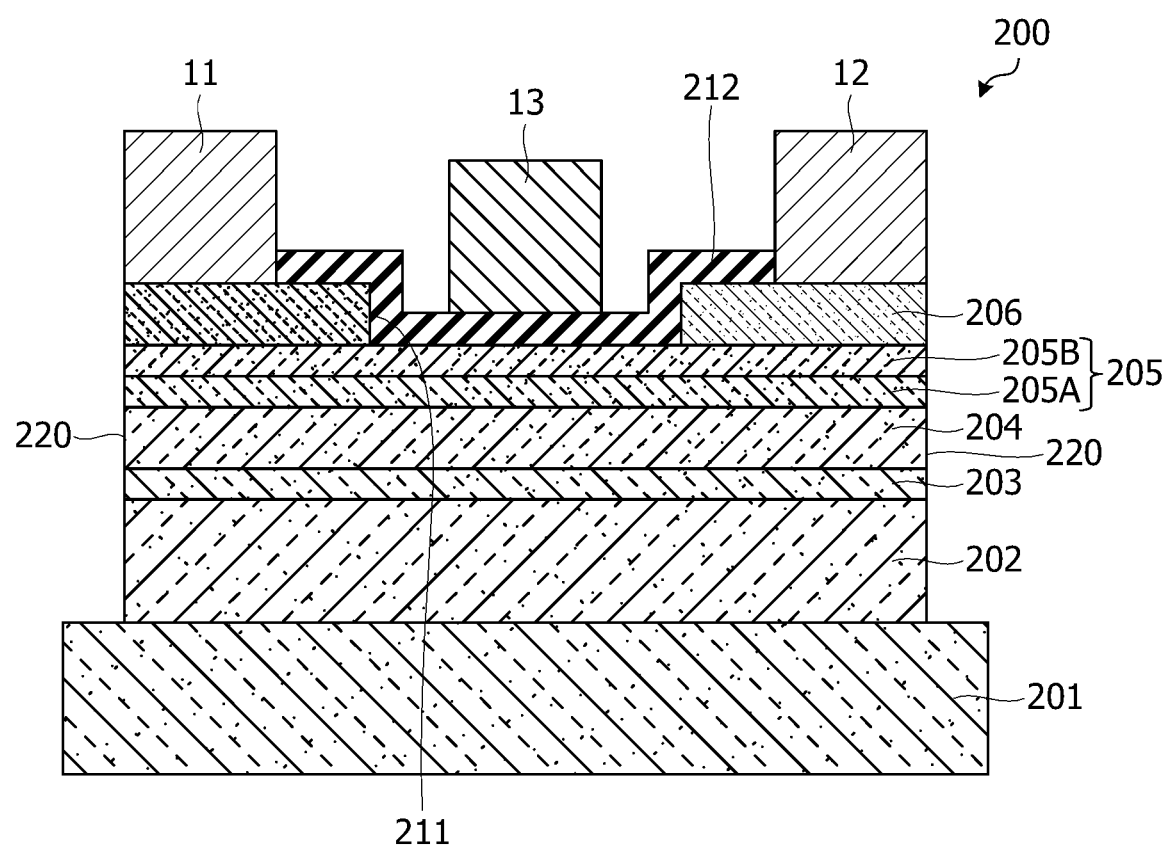
FIG. 7 is a sectional view illustrating a compound semiconductor device according to a second embodiment.

Next, a second embodiment will be described. The second embodiment relates to a compound semiconductor device including an InP-based HEMT. FIG. 7 is a sectional view illustrating the compound semiconductor device according to the second embodiment.

As illustrated in FIG. 7, a compound semiconductor device 200 according to the second embodiment includes a substrate 201, a buffer layer 202, a carrier supply layer 203, a channel layer 204, an etching stopper layer 205, a cap layer 206, an insulating layer 212, a source electrode 11, a drain electrode 12, and a gate electrode 13.

The substrate 201 is, for example, a semi-insulating InP substrate. The buffer layer 202 is disposed over the substrate 201. The buffer layer 202 is, for example, an InAlAs layer (i-InAlAs layer) that has a thickness of about 300 nm and that is not intentionally doped with any impurity. The carrier supply layer 203 is formed, for example, by doping a surface of the buffer layer 202 with an impurity such as delta doping (atomic layer doping). As the impurity, for example, Si, Sn, or Se, or any arbitrary combination of Si, Sn, or Se is used. The channel layer 204 is disposed over the carrier supply layer 203. The channel layer 204 is, for example, an InGaAs layer (i-InGaAs layer) that has a thickness of about 10 nm and that is not intentionally doped with any impurity.

The etching stopper layer 205 is disposed over the channel layer 204. The etching stopper layer 205 includes a first layer 205A and a second layer 205B. The first layer 205A is disposed over the channel layer 204. The first layer 205A is, for example, an n-type InP layer (n-InP layer) having a thickness of about 1 nm to 4 nm. The second layer 205B is disposed over the first layer 205A. The second layer 205B is, for example, an n-type InGaP layer (n-InGaP layer) having a thickness of about 1 nm to 4 nm. A range of an In composition (atomic composition of two elements of In and Ga) of the InGaP layer constituting the second layer 205B is, for example, 50% to 95%. A difference in lattice constant between the first layer 205A and the channel layer 204 is smaller than a difference in lattice constant between the second layer 205B and the channel layer 204. The cap layer 206 is formed over the etching stopper layer 205. The cap layer 206 is, for example, an n-type InGaAs layer (n-InGaAs layer) having a thickness of about 50 nm.

An element isolation region 220 are formed in the buffer layer 202, the carrier supply layer 203, the channel layer 204, the etching stopper layer 205, and the cap layer 206. A recess 211 that reaches the etching stopper layer 205 is formed in the cap layer 206 in an element region partitioned by the element isolation region 220.

The source electrode 11 and the drain electrode 12 are disposed over the cap layer 206 with the recess 211 interposed between the source electrode 11 and the drain electrode 12 in plan view. The source electrode 11 and the drain electrode 12 each include, for example, a Ti film having a thickness of 10 nm, a Pt film having a thickness of about 30 nm, and a Au film having a thickness of about 300 nm. The Pt film is disposed over the Ti film, and the Au film is disposed over the Pt film.

The insulating layer 212 is disposed over the etching stopper layer 205 inside the recess 211. The insulating layer 212 may also be formed over an inner wall surface of the recess 211 and over an upper surface of the cap layer 206. The insulating layer 212 is, for example, an aluminum oxide layer having a thickness of about 2 nm. The gate electrode 13 is disposed over a portion, of the insulating layer 212, located inside the recess 211. The gate electrode 13 includes, for example, a Ti film having a thickness of about 10 nm, a Pt film having a thickness of about 30 nm, and a Au film having a thickness of about 300 nm. The Pt film is disposed over the Ti film, and the Au film is disposed over the Pt film. A sectional shape of the gate electrode 13 may be a T-shape. The compound semiconductor device 200 has a metal-oxide-semiconductor (MOS)-type gate.

In the second embodiment, a 2DEG is generated in the vicinity of an interface of the channel layer 204 to the carrier supply layer 203.

Next, a method for manufacturing the compound semiconductor device 200 according to the second embodiment will be described. FIGS. 8 to 13 are sectional views illustrating the method for manufacturing the compound semiconductor device 200 according to the second embodiment.

Figure 8:
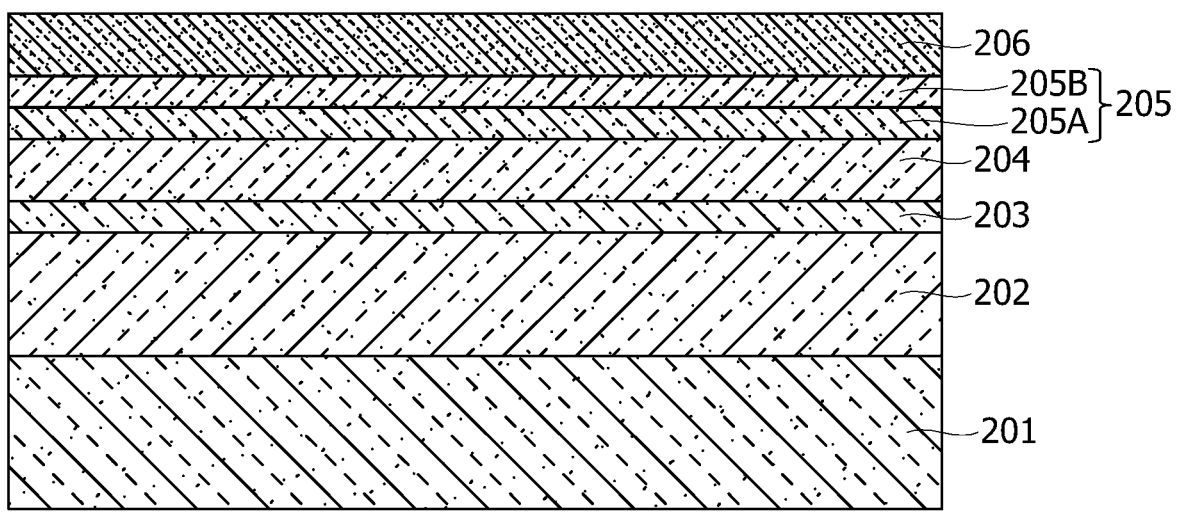
FIG. 8 is a sectional view (part 1) illustrating a method for manufacturing the compound semiconductor device according to the second embodiment.

First, as illustrated in FIG. 8, the buffer layer 202 is formed over the substrate 201. The buffer layer 202 may be formed by using, for example, a crystal growth method such as a metal-organic chemical vapor deposition (MOCVD) method.

Next, as illustrated also in FIG. 8, the carrier supply layer 203 is formed over a surface of the buffer layer 202. The carrier supply layer 203 may be formed, for example, by doping with an impurity such as delta doping (atomic layer doping). Doping is performed with, for example, silicon as the impurity at about $2 \times 10^{12}$ cm$^{-2}$. The buffer layer 202 is doped with the impurity in a sheet-like manner, so that a peak of an impurity profile is set to a depth of about 3 nm to about 5 nm from the surface of the buffer layer 202. A portion closer to the surface with respect to the peak may be regarded as a spacer layer.

Thereafter, as illustrated also in FIG. 8, the channel layer 204 is formed over the carrier supply layer 203. The first layer 205A is formed over the channel layer 204. The second layer 205B is formed over the first layer 205A. The cap layer 206 is formed over the second layer 205B. The channel layer 204, the first layer 205A, the second layer 205B, and the cap layer 206 may be formed by using, for example, the crystal growth method such as the MOCVD method.

Figure 9:
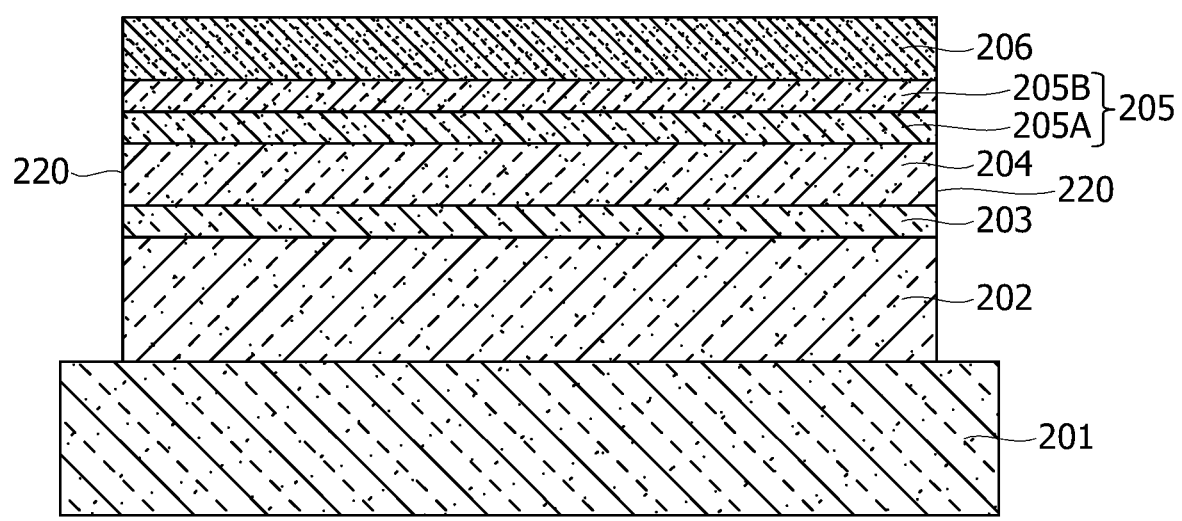
FIG. 9 is a sectional view (part 2) illustrating the method for manufacturing the compound semiconductor device according to the second embodiment.

Subsequently, as illustrated in FIG. 9, the element isolation region 220 are formed in the buffer layer 202, the carrier supply layer 203, the channel layer 204, the etching stopper layer 205, and the cap layer 206. The element isolation region 220 are formed, for example, in a following manner. First, a photoresist mask that exposes a region where the element isolation region 220 are to be formed and that covers the other region is formed over the cap layer 206, and the cap layer 206 is etched with a mixed solution of phosphoric acid and aqueous hydrogen peroxide, for example. This etching stops at the surface of the etching stopper layer 205. Next, the etching stopper layer 205 is etched with, for example, hydrochloric acid. This etching stops at the surface of the channel layer 204. Thereafter, the channel layer 204, the carrier supply layer 203, and the buffer layer 202 are etched with a mixed solution of phosphoric acid and aqueous hydrogen peroxide, for example. In this manner, the element isolation region 220 may be formed. After the element isolation region 220 are formed, the photoresist mask is removed.

Figure 10:
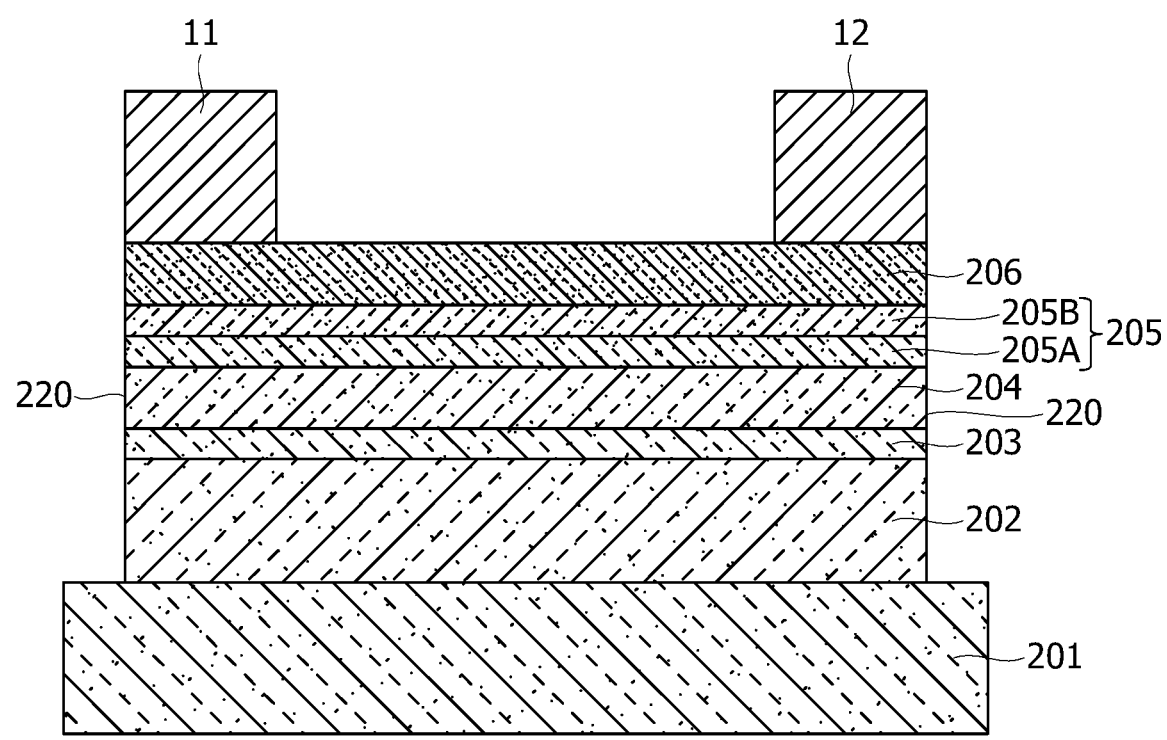
FIG. 10 is a sectional view (part 3) illustrating the method for manufacturing the compound semiconductor device according to the second embodiment.

Next, as illustrated in FIG. 10, the source electrode 11 and the drain electrode 12 are formed over the cap layer 206 in the element region partitioned by the element isolation region 220. In formation of the source electrode 11 and the drain electrode 12, a photoresist mask that exposes a region where the source electrode 11 is to be formed and a region where the drain electrode 12 is to be formed and that covers the other region is formed over the cap layer 206. The Ti film, the Pt film, and the Au film are formed by using a vapor deposition method, and the photoresist mask is removed together with the Ti film, the Pt film, and the Au film located thereover. In this manner, the source electrode 11 and the drain electrode 12 may be formed by using a lift-off method.

Figure 11:
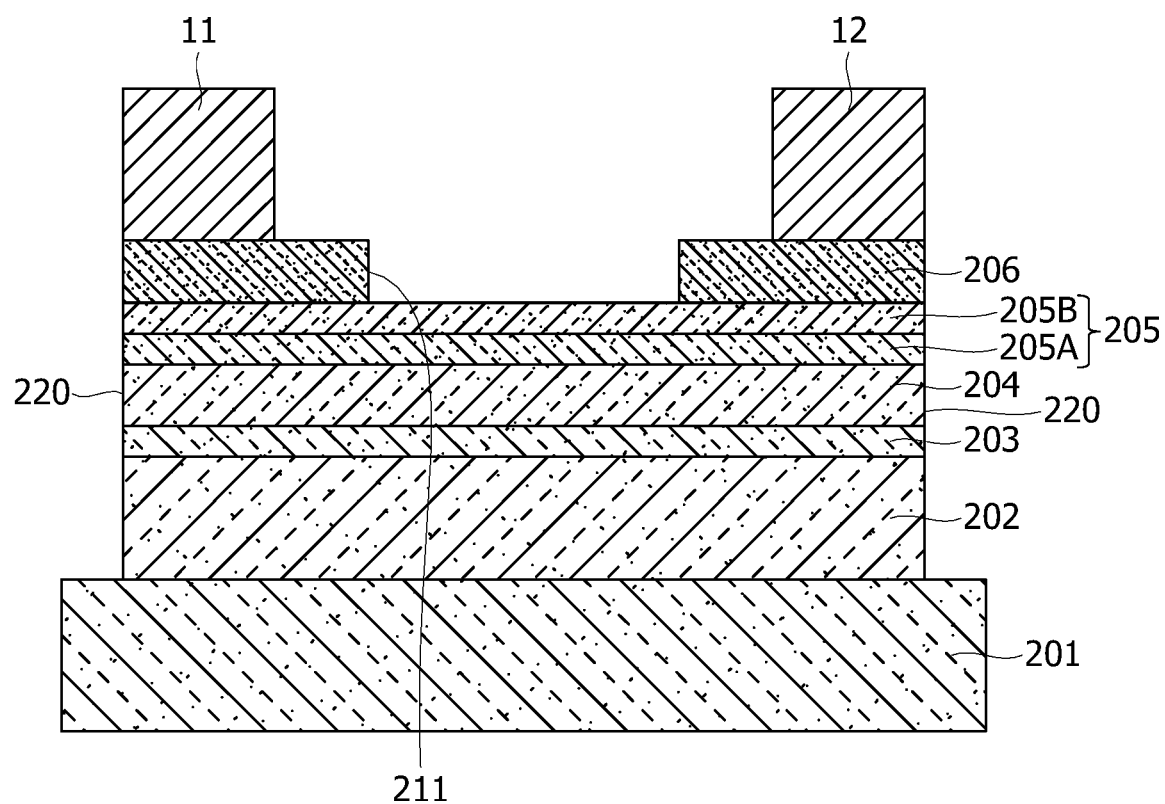
FIG. 11 is a sectional view (part 4) illustrating the method for manufacturing the compound semiconductor device according to the second embodiment.

Thereafter, as illustrated in FIG. 11, the recess 211 for the gate electrode 13 is formed in the cap layer 206 between the source electrode 11 and the drain electrode 12 in plan view. The recess 211 may be formed in such a manner that a mask that exposes a region where the recess 211 is to be formed and that covers the other region is formed over the cap layer 206 by using electron beam lithography and the cap layer 206 is etched with a mixed solution of phosphoric acid and aqueous hydrogen peroxide, for example. This etching stops at the surface of the etching stopper layer 205.

Figure 12:
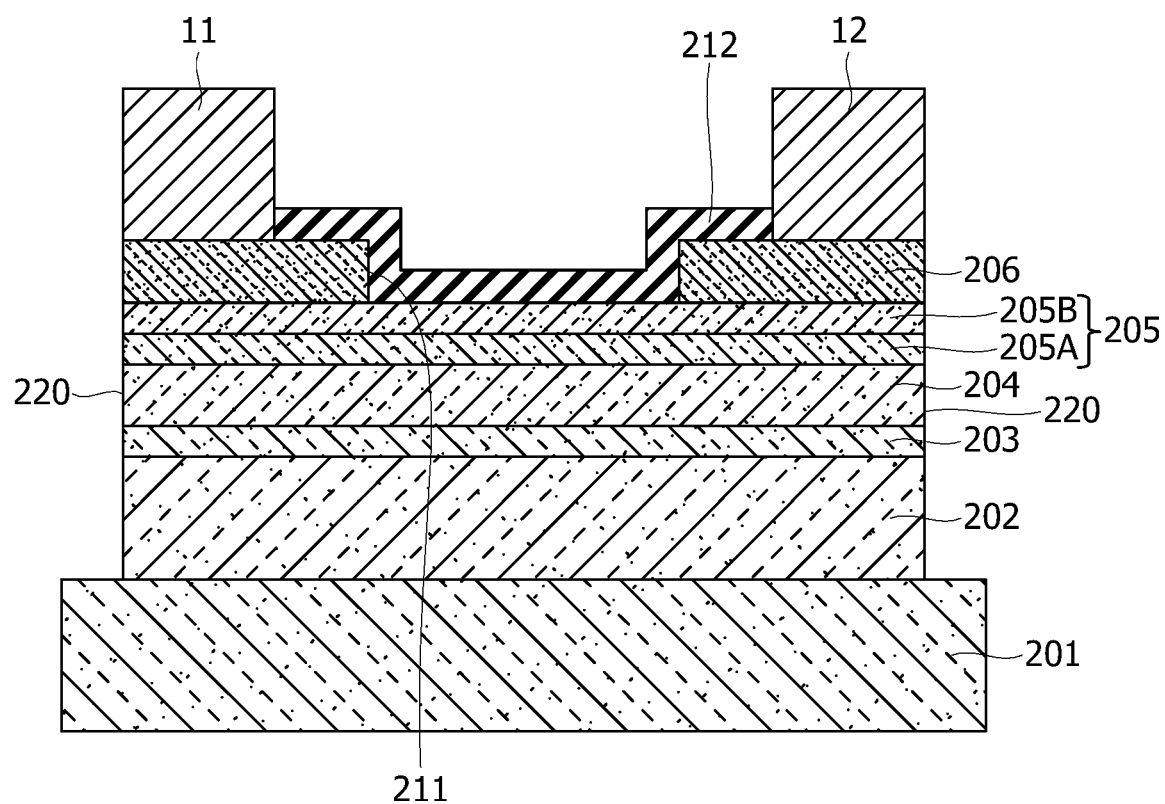
FIG. 12 is a sectional view (part 5) illustrating the method for manufacturing the compound semiconductor device according to the second embodiment.

Subsequently, as illustrated in FIG. 12, the insulating layer 212 that covers the upper surface of the etching stopper layer 205 and the upper surface and side surfaces of the cap layer 206 in the recess 211 is formed. The insulating layer 212 may be formed, for example, by using an atomic layer deposition (ALD) method.

Figure 13:
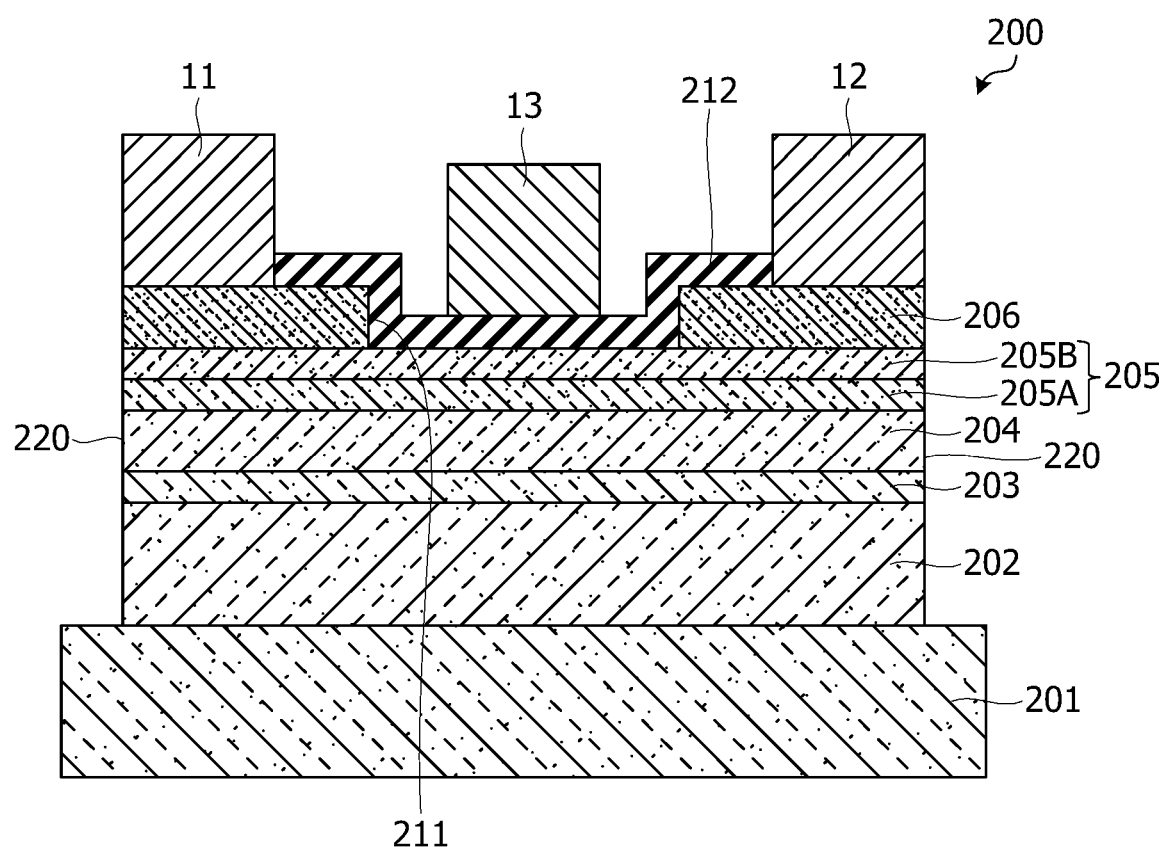
FIG. 13 is a sectional view (part 6) illustrating the method for manufacturing the compound semiconductor device according to the second embodiment.

Next, as illustrated in FIG. 13, the gate electrode 13 is formed over the insulating layer 212 in the recess 211. In formation of the gate electrode 13, a mask, for example, a multilayer mask, that exposes a region where the gate electrode 13 is to be formed and that covers the other region is formed over the insulating layer 212 by using the electron beam lithography; the Ti film, the Pt film, and the Au film are formed by using the vapor deposition method; and the mask is removed together with the Ti film, the Pt film, and the Au film located thereover, for example. In this manner, the gate electrode 13 may be formed by using the lift-off method.

A passivation film, wiring, and the like are then formed as appropriate, so that the compound semiconductor device 200 is completed.

In the second embodiment, the etching stopper layer 205 includes the first layer 205A and the second layer 205B. Since the first layer 205A is an InP layer and the second layer 205B is an InGaP layer, the In composition of the first layer 205A is greater than that of the second layer 205B and the difference in lattice constant between the first layer 205A and the channel layer 204 is smaller than the difference in lattice constant between the second layer 205B and the channel layer 204. Therefore, as compared with a case where the etching stopper layer 205 is constituted only by the InGaP layer, a lattice mismatch between the channel layer 204 and the etching stopper layer 205 may be reduced and thus a decrease in concentration of the 2DEG because of the lattice mismatch may be suppressed. As compared with a case where the etching stopper layer 205 is constituted only by the InP layer, a larger band gap of the etching stopper layer 205 may be ensured and thus a leakage current may be suppressed.

Since etching of the cap layer 206 for forming the recess 211 may be stopped at the upper surface of the etching stopper layer 205, manufacturing may be performed with a high accuracy.

The insulating layer 212 is not limited to an aluminum oxide layer. The insulating layer 212 may include an oxide layer, a nitride layer, or an oxynitride layer of aluminum, hafnium, titanium, or silicon, or any arbitrary combination of the oxide layer, the nitride layer, or the oxynitride layer. The insulating layer 212 may have a thickness of 0.5 nm to 10 nm, for example.

Third Embodiment

Figure 14:
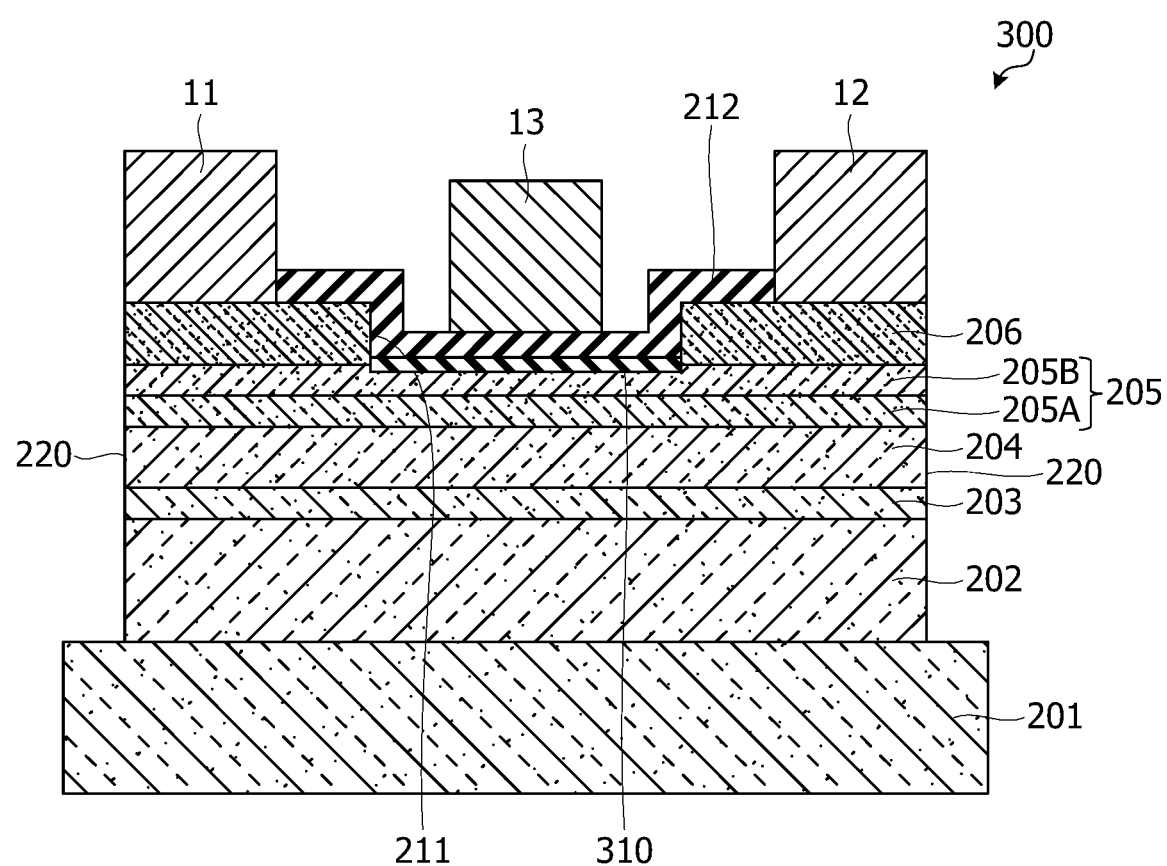
FIG. 14 is a sectional view illustrating a compound semiconductor device according to a third embodiment.

Next, a third embodiment will be described. The third embodiment also relates to a compound semiconductor device including an InP-based HEMT. The third embodiment is different from the second embodiment mainly in that an oxide layer is provided between a cap layer 206 and an insulating layer 212. FIG. 14 is a sectional view illustrating the compound semiconductor device according to the third embodiment.

As illustrated in FIG. 14, a compound semiconductor device 300 according to the third embodiment includes an oxide layer 310 between an etching stopper layer 205 and the insulating layer 212 inside a recess 211. The oxide layer 310 contains gallium oxide ($GaO_x$). A main component of the oxide layer 310 may be gallium oxide, or the oxide layer 310 may be a gallium oxide layer. The oxide layer 310 has a thickness of 0.5 nm or greater, for example.

Figure 15:
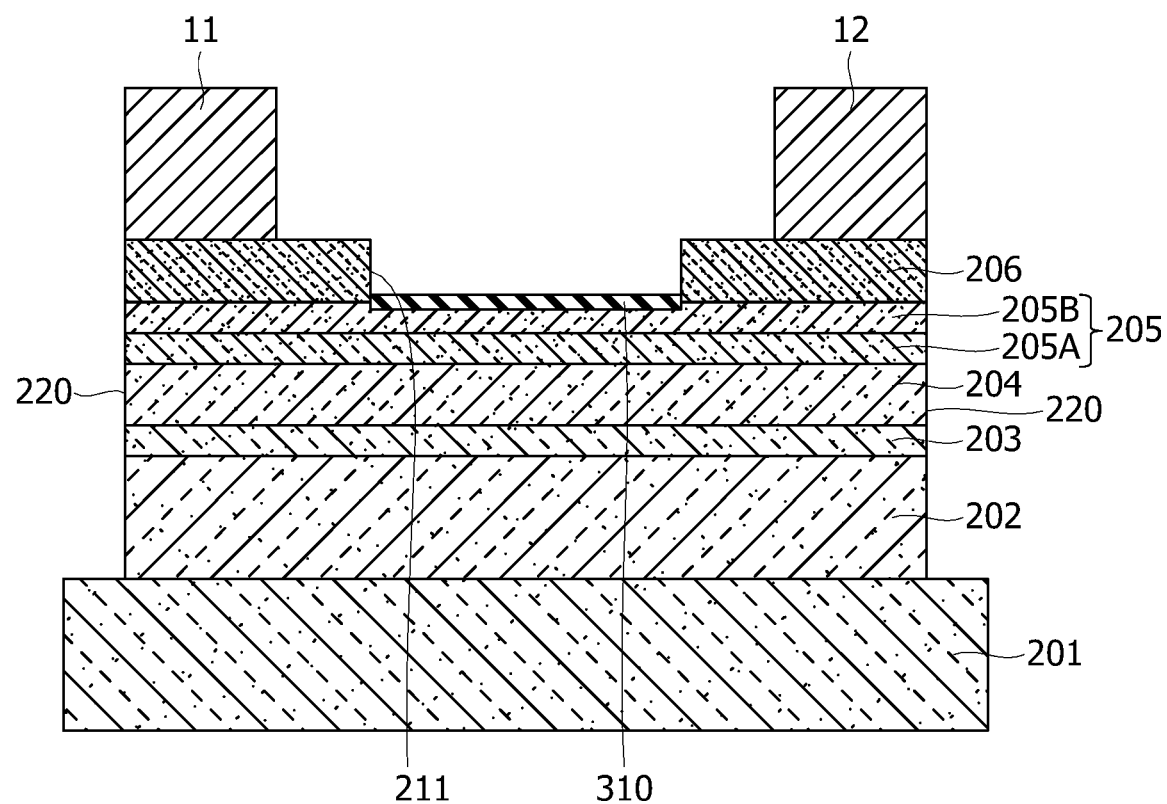
FIG. 15 is a sectional view (part 1) illustrating a method for manufacturing the compound semiconductor device according to the third embodiment.
Figure 16:
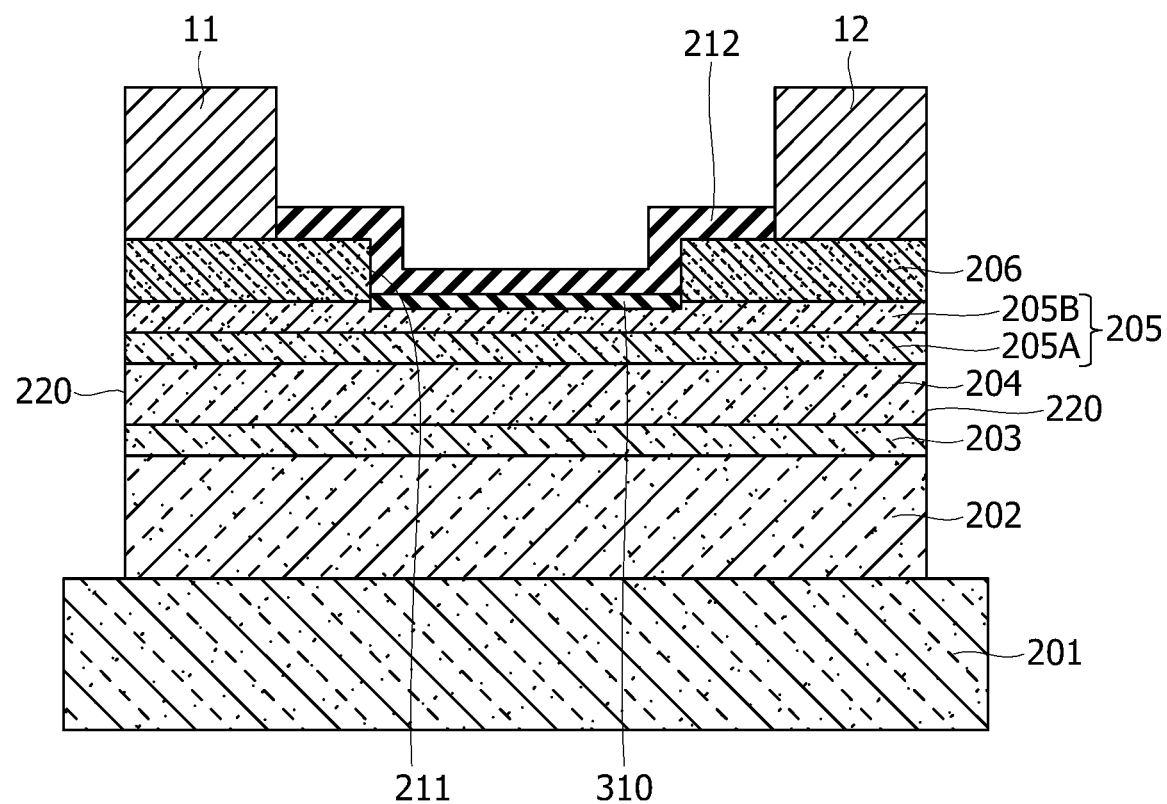
FIG. 16 is a sectional view (part 2) illustrating the method for manufacturing the compound semiconductor device according to the third embodiment.
Figure 17:
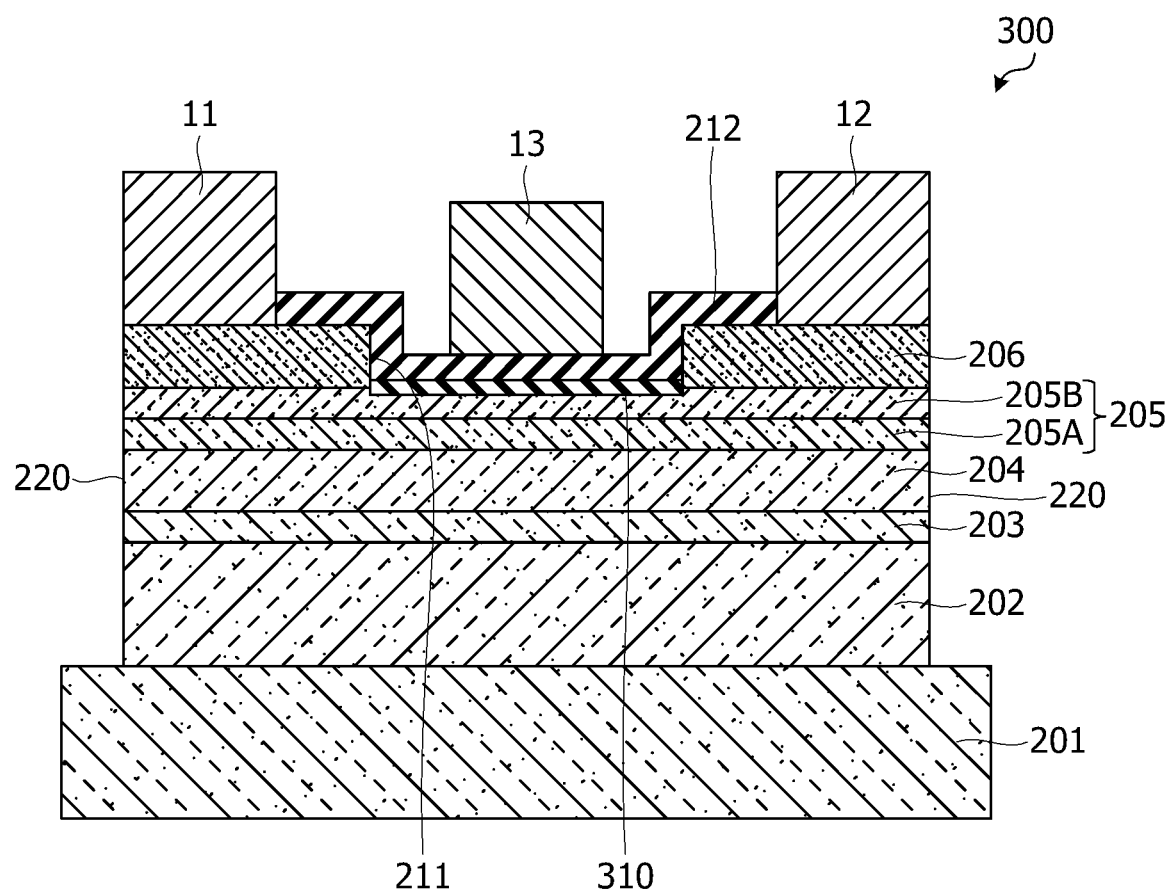
FIG. 17 is a sectional view (part 3) illustrating the method for manufacturing the compound semiconductor device according to the third embodiment.

Next, a method for manufacturing the compound semiconductor device 300 according to the third embodiment will be described. FIGS. 15 to 17 are sectional views illustrating the method for manufacturing the compound semiconductor device 300 according to the third embodiment.

First, as in the second embodiment, the processes up to formation of the recess 211 are performed (see FIG. 11). Next, steam treatment is performed on the surface of the etching stopper layer 205 exposed from the recess 211. A temperature of the steam treatment is about 200° C. to 300° C. Before the steam treatment, a natural oxide film containing indium gallium oxide is present at the surface of the etching stopper layer 205 exposed from the recess 211. When the steam treatment is performed, indium in indium gallium oxide becomes indium oxide to volatilize. Thus, the natural oxide film is removed and gallium oxide is left.

Therefore, as illustrated in FIG. 15, the oxide layer 310 containing gallium oxide is formed through the steam treatment.

Thereafter, as illustrated in FIG. 16, the insulating layer 212 that covers an upper surface of the oxide layer 310 and an upper surface and side surfaces of the cap layer 206 is formed. Subsequently, as illustrated in FIG. 17, a gate electrode 13 is formed over the insulating layer 212 in the recess 211.

A passivation film, wiring, and the like are then formed as appropriate, so that the compound semiconductor device 300 is completed.

Also in the third embodiment, effects similar to those of the second embodiment may be obtained.

In a case where a natural oxide film containing indium gallium oxide is present at the surface of the etching stopper layer 205 exposed from the recess 211, an influence of an interface state included in the natural oxide film makes it difficult to control a drain current by using a gate voltage and thus a pinch-off defect may occur. By contrast, in the third embodiment, since the natural oxide film containing indium gallium oxide is removed and the oxide layer 310 containing gallium oxide is formed, the pinch-off defect may be suppressed.

Pinch-off characteristics of the second embodiment and the third embodiment will be described by comparison with a reference example. The reference example corresponds to the structure of the second embodiment in which the first layer 205A is removed and thus the etching stopper layer 205 is constituted only by the second layer 205B of InGaP.

Figure 18:
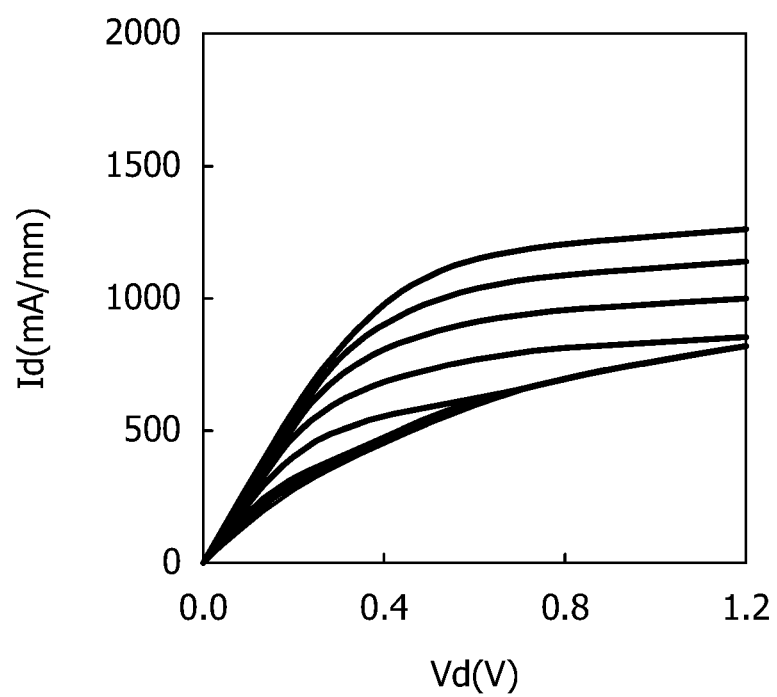
FIG. 18 is a diagram illustrating a relationship between a drain voltage and a drain current in a reference example.
Figure 19:
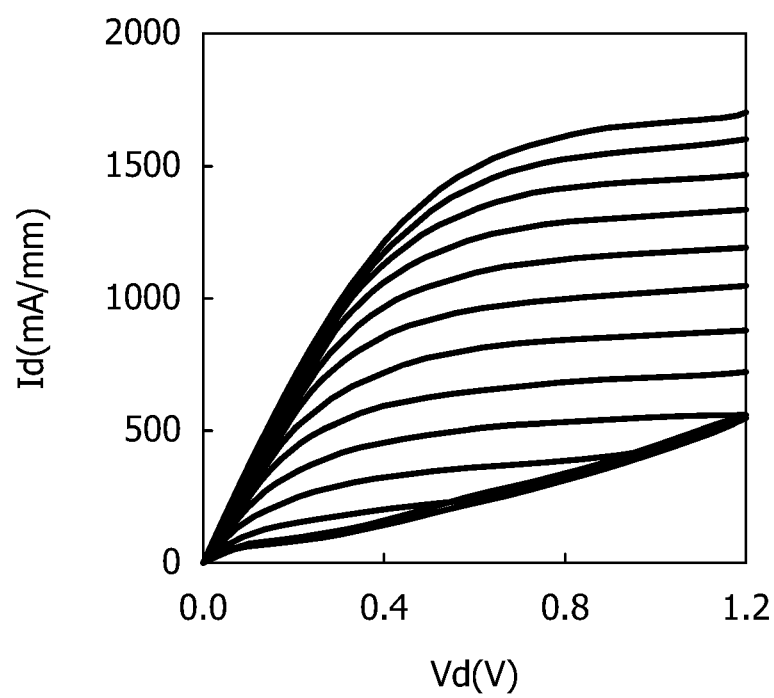
FIG. 19 is a diagram illustrating a relationship between a drain voltage and a drain current in the second embodiment.
Figure 20:
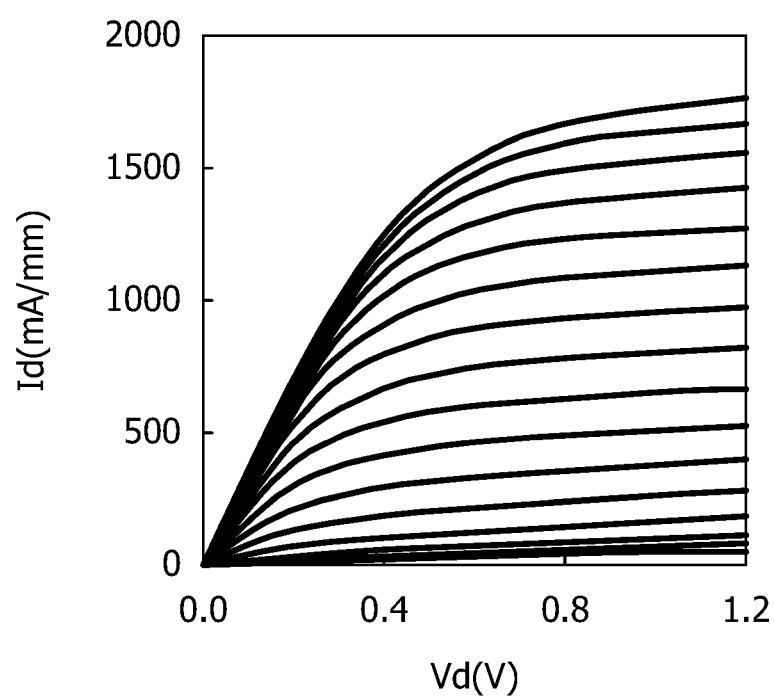
FIG. 20 is a diagram illustrating a relationship between a drain voltage and a drain current in the third embodiment.

For the reference example, the second embodiment, and the third embodiment, a relationship between a drain voltage Vd and a drain current Id obtained when a gate voltage is changed is measured. FIG. 18 is a diagram illustrating the relationship between the drain voltage Vd and the drain current Id in the reference example. FIG. 19 is a diagram illustrating the relationship between the drain voltage Vd and the drain current Id in the second embodiment. FIG. 20 is a diagram illustrating the relationship between the drain voltage Vd and the drain current Id in the third embodiment.

As illustrated in FIGS. 18 to 20, in the second embodiment and the third embodiment, a greater drain current than that in the reference example is obtained. In the third embodiment, the pinch-off defect is suppressed as compared with the second embodiment.

Fourth Embodiment

Figure 21:
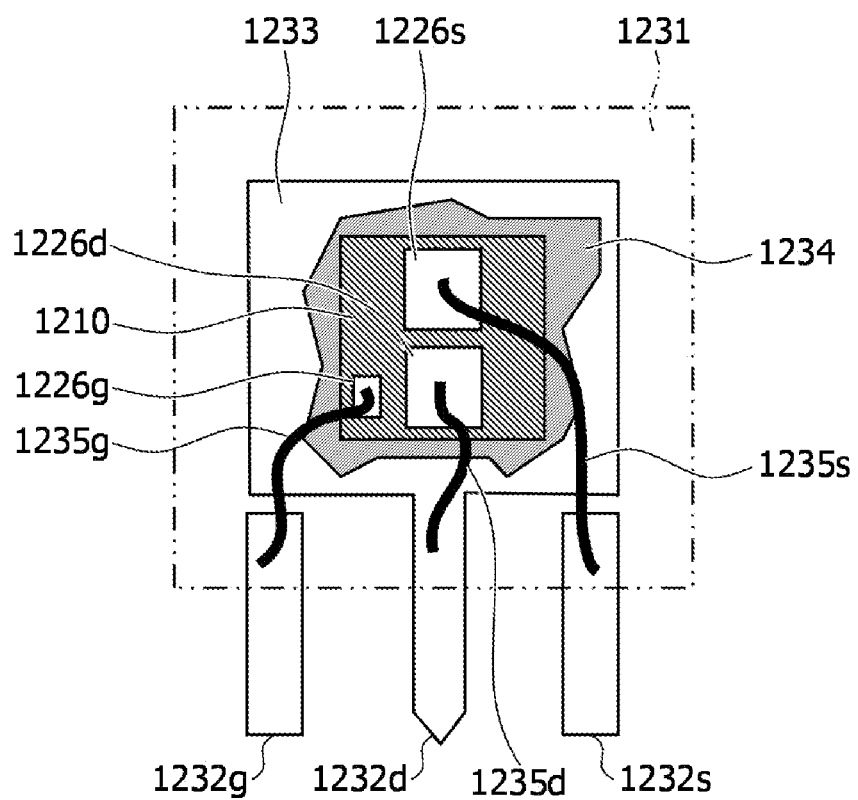
FIG. 21 is a diagram illustrating a discrete package according to a fourth embodiment.

Next, a fourth embodiment will be described. The fourth embodiment relates to a discrete package of a HEMT. FIG. 21 is a diagram illustrating the discrete package according to the fourth embodiment.

In the fourth embodiment, as illustrated in FIG. 21, a back surface of a semiconductor device 1210 having a structure that is substantially the same as that of any of the first to third embodiments is fixed to a land (die pad) 1233 by using a die attaching agent 1234 such as solder. One of ends of a wire 1235d such as an Al wire is coupled to a drain pad 1226d to which the drain electrode 12 is coupled, and the other end of the wire 1235d is coupled to a drain lead 1232d integrated with the land 1233. One of ends of a wire 1235s such as an Al wire is coupled to a source pad 1226s to which the source electrode 11 is coupled, and the other end of the wire 1235s is coupled to a source lead 1232s independent from the land 1233. One of ends of a wire 1235g such as an Al wire is coupled to a gate pad 1226g to which the gate electrode 13 is coupled, and the other end of the wire 1235g is coupled to a gate lead 1232g independent from the land 1233. Further, the land 1233, the semiconductor device 1210, and so forth are packaged by a mold resin 1231 such that part of the gate lead 1232g, part of the drain lead 1232d, and part of the source lead 1232s protrude.

Such a discrete package may be manufactured, for example, in a following manner. First, the semiconductor device 1210 is fixed to the land 1233 of a lead frame by using the die attaching agent 1234 such as solder. Next, by bonding using the wires 1235g, 1235d, and 1235s, the gate pad 1226g is coupled to the gate lead 1232g of the lead frame, the drain pad 1226d is coupled to the drain lead 1232d of the lead frame, and the source pad 1226s is coupled to the source lead 1232s of the lead frame. Thereafter, sealing is performed using the mold resin 1231 in accordance with a transfer molding method. Subsequently, the lead frame is cut off.

Fifth Embodiment

Figure 22:
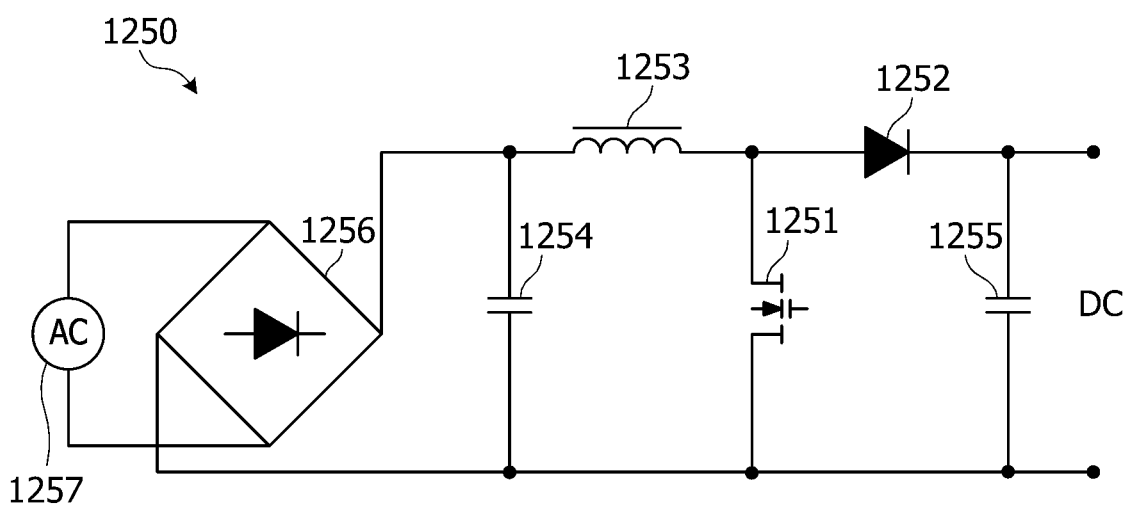
FIG. 22 is a connection diagram illustrating a power factor correction (PFC) circuit according to a fifth embodiment.

Next, a fifth embodiment will be described. The fifth embodiment relates to a PFC circuit including a HEMT. FIG. 22 is a connection diagram illustrating the PFC circuit according to the fifth embodiment.

A PFC circuit 1250 includes a switch element (transistor) 1251, a diode 1252, a choke coil 1253, capacitors 1254 and 1255, a diode bridge 1256, and an alternate current power source (AC) 1257. A drain electrode of the switch element 1251 is coupled to an anode terminal of the diode 1252 and one of terminals of the choke coil 1253. A source electrode of the switch element 1251 is coupled to one of terminals of the capacitor 1254 and one of terminals of the capacitor 1255. The other terminal of the capacitor 1254 is coupled to the other terminal of the choke coil 1253. The other terminal of the capacitor 1255 is coupled to a cathode terminal of the diode 1252. A gate driver is coupled to a gate electrode of the switch element 1251. The AC 1257 is coupled to both the terminals of the capacitor 1254 with the diode bridge 1256 interposed between the AC 1257 and the capacitor 1254. A direct current power source (DC) is coupled to both the terminals of the capacitor 1255. In the present embodiment, a semiconductor device having a structure that is the substantially the same as that according to any of the first to third embodiments is used as the switch element 1251.

In manufacturing of the PFC circuit 1250, for example, the switch element 1251 is coupled to the diode 1252, the choke coil 1253, and so forth by using solder or the like.

Sixth Embodiment

Figure 23:
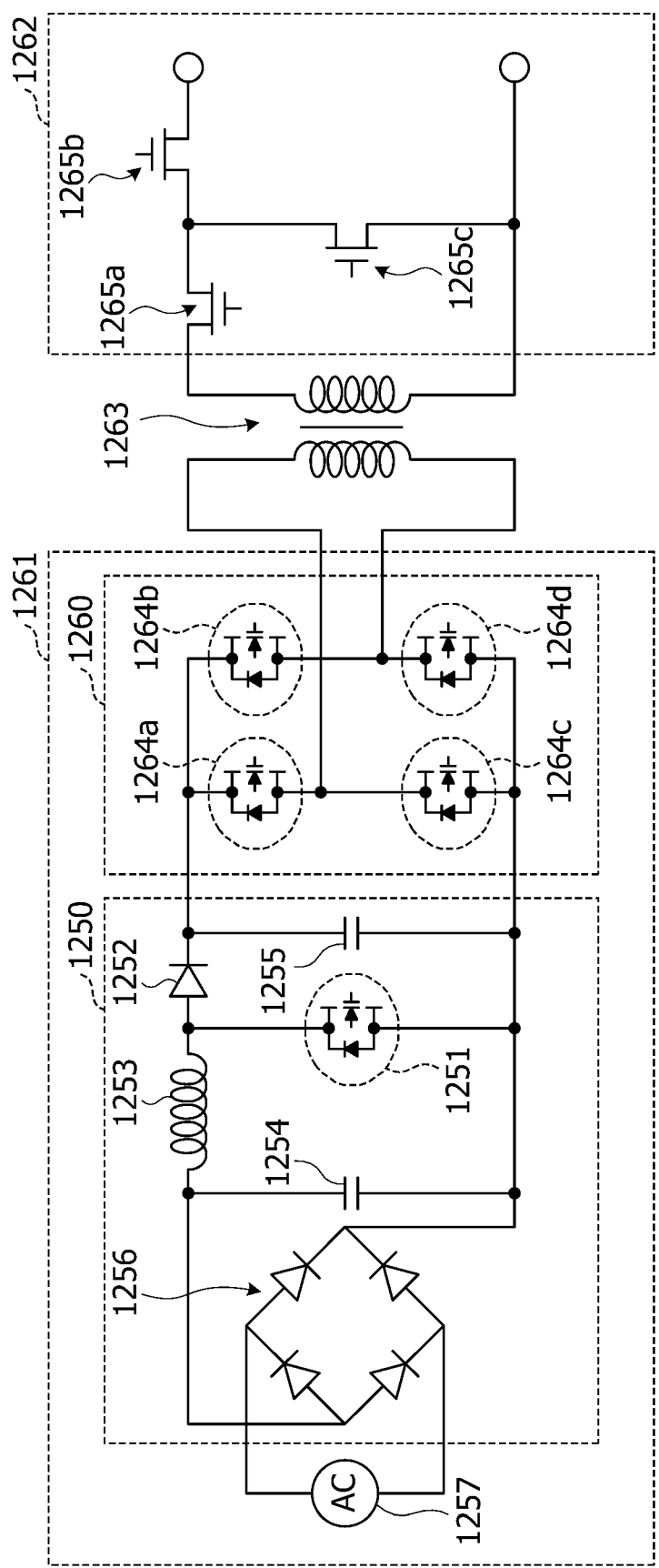
FIG. 23 is a connection diagram illustrating a power source apparatus according to a sixth embodiment.

Next, a sixth embodiment will be described. The sixth embodiment relates to a power source apparatus that includes HEMTs and that is suitable as a server power source. FIG. 23 is a connection diagram illustrating the power source apparatus according to the sixth embodiment.

The power source apparatus includes a primary circuit 1261 of high voltage, a secondary circuit 1262 of low voltage, and a transformer 1263 disposed between the primary circuit 1261 and the secondary circuit 1262.

The primary circuit 1261 includes the PFC circuit 1250 according to the fifth embodiment, and an inverter circuit, for example, a full-bridge inverter circuit 1260, coupled to both the terminals of the capacitor 1255 of the PFC circuit 1250. The full-bridge inverter circuit 1260 includes a plurality of (in this case, four) switch elements 1264a, 1264b, 1264c, and 1264d.

The secondary circuit 1262 includes a plurality of (in this case, three) switch elements 1265a, 1265b, and 1265c.

In the present embodiment, semiconductor devices having a structure that is substantially the same as that of any of the first to third embodiments are used as the switch element 1251 of the PFC circuit 1250 constituting the primary circuit 1261 and the switch elements 1264a, 1264b, 1264c, and 1264d of the full-bridge inverter circuit 1260. By contrast, normal metal-insulator-semiconductor (MIS)-type field effect transistors (FETs) using silicon are used as the switch elements 1265a, 1265b, and 1265c of the secondary circuit 1262.

Seventh Embodiment

Figure 24:
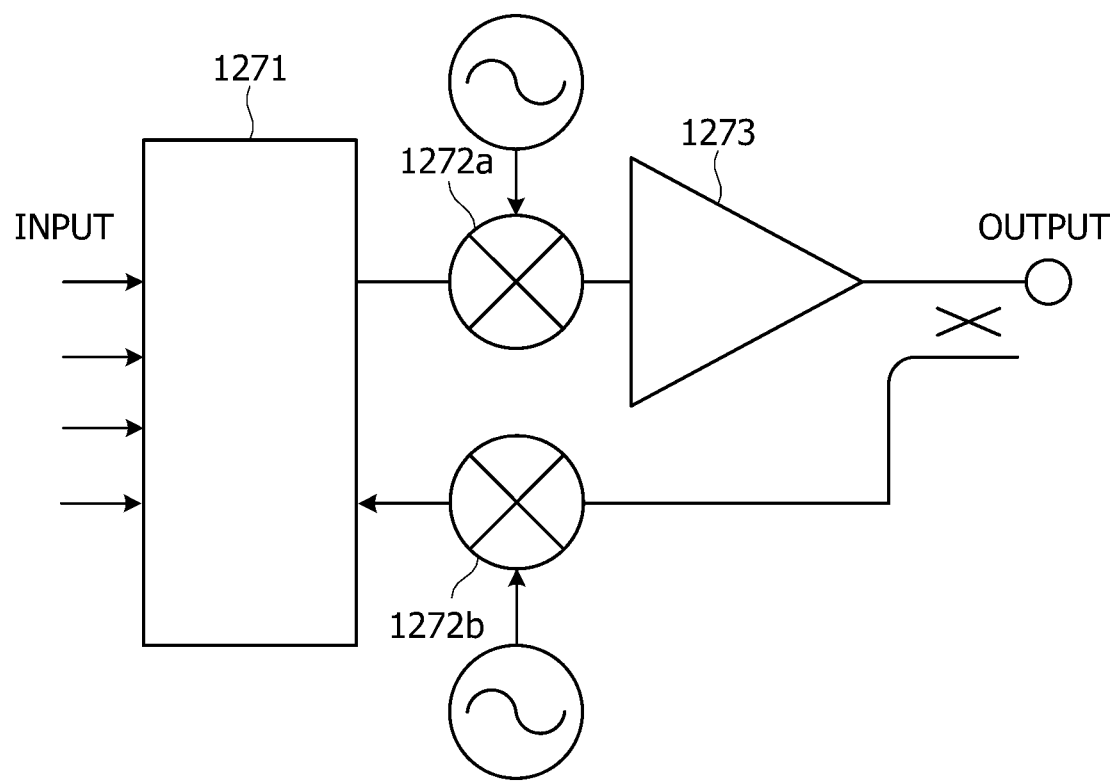
FIG. 24 is a connection diagram illustrating an amplifier according to a seventh embodiment.

Next, a seventh embodiment will be described. The seventh embodiment relates to an amplifier including a HEMT. FIG. 24 is a connection diagram illustrating the amplifier according to the seventh embodiment.

The amplifier includes a digital predistortion circuit 1271, mixers 1272a and 1272b, and a power amplifier 1273.

The digital predistortion circuit 1271 compensates for a nonlinear distortion of an input signal. The mixer 1272a mixes the input signal whose nonlinear distortion has been compensated for with an alternate current signal. The power amplifier 1273 includes a semiconductor device having a structure that is substantially the same as that of any of the first to third embodiments, and amplifies the input signal mixed with the alternate current signal. In the present embodiment, for example, by switching a switch, an output-side signal may be mixed with an alternate current signal in the mixer 1272b and the resultant signal may be transmitted to the digital predistortion circuit 1271. This amplifier may be used as a high-frequency amplifier or a high-output amplifier. The high-frequency amplifier may be used, for example, in a transmission/reception apparatus for a mobile phone base station, in a radar apparatus, and in a microwave generation apparatus.

Eighth Embodiment

Figure 25:
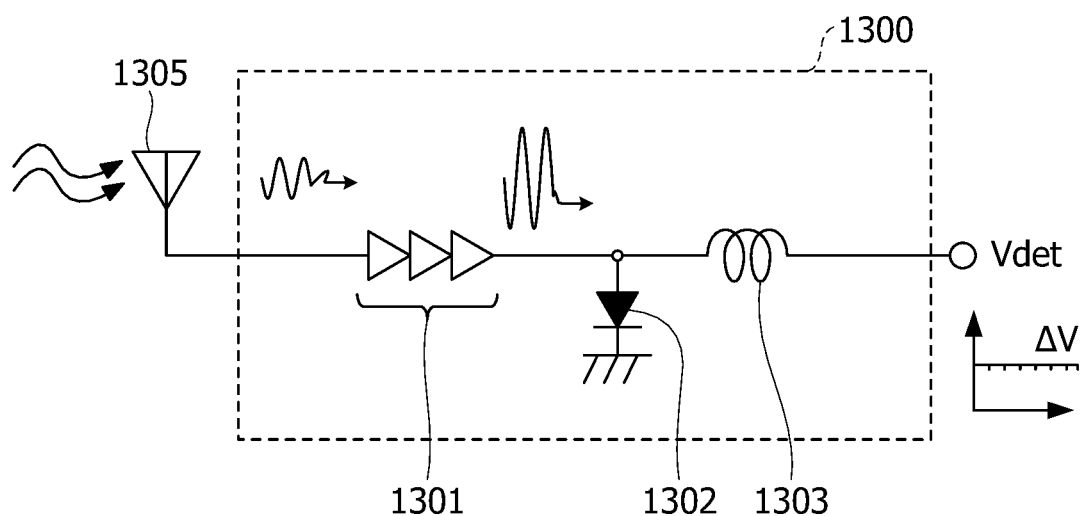
FIG. 25 is a diagram illustrating a reception monolithic microwave integrated circuit (MMIC) according to an eighth embodiment.

Next, an eighth embodiment will be described. An eighth embodiment relates to a reception MMIC. FIG. 25 is a diagram illustrating the reception MMIC according to the eighth embodiment.

As illustrated in FIG. 25, a reception MMIC 1300 according to the eighth embodiment includes a low-noise amplifier (LNA) 1301, a wave detector 1302, and an inductor 1303. The LNA 1301, the wave detector 1302, and the inductor 1303 are integrated over a single InP substrate. The LNA 1301 includes the InP-based HEMT (compound semiconductor device) according to any of the first to third embodiments.

In the eighth embodiment, for example, the source electrode 11 of the InP-based HEMT included in the LNA 1301 and a cathode electrode of the wave detector 1302 are grounded, and the drain electrode 12 of the InP-based HEMT and an anode electrode of the wave detector 1302 are coupled to one of ends of the inductor 1303. An antenna 1305 that receives a radio wave in the millimeter-wave band or the terahertz band is coupled to the gate electrode 13 of the InP-based HEMT, and a wave detection signal $V_{det}$ is output from the other end of the inductor 1303. As the wave detection signal $V_{det}$, for example, a potential difference $\Delta V$ of several hundreds of mV is output.

The reception MMIC 1300 according to the eighth embodiment includes the InP-based HEMT (compound semiconductor device) according to any of the first to third embodiments and thus may obtain good characteristics.

Although the preferred embodiments and the like have been described in detail above, the present disclosure is not limited to the above-described embodiments and the like. Various modifications and replacements may be made to the above-described embodiments and the like without departing from the scope of the claims.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A compound semiconductor device comprising:
   a carrier supply layer;
   a channel layer disposed over the carrier supply layer and configured to include InGaAs; and
   an etching stopper layer disposed over the channel layer, and configured to include
   a first layer disposed over the channel layer and configured to include $In_{x1}Ga_{1-x1}P$, and
   a second layer disposed over the first layer and configured to include $In_{x2}Ga_{1-x2}P$,
   wherein x1 is greater than 0 and less than or equal to 1, x2 is greater than or equal to 0 and less than 1, and x1 is greater than x2.

2. The compound semiconductor device according to claim 1,
   wherein a difference in lattice constant between the first layer and the channel layer is smaller than a difference in lattice constant between the second layer and the channel layer.

3. The compound semiconductor device according to claim 1, further comprising:
   a cap layer disposed over the etching stopper layer and configured to include a recess that reaches the etching stopper layer; and
   an oxide layer disposed over the etching stopper layer inside the recess and configured to include gallium oxide.

4. The compound semiconductor device according to claim 3,
   wherein a thickness of the oxide layer is greater than or equal to 0.5 nm.

5. The compound semiconductor device according to claim 3, further comprising:
   a gate electrode disposed over the oxide layer.

6. The compound semiconductor device according to claim 5, further comprising:
   an insulating layer disposed between the oxide layer and the gate electrode.

7. The compound semiconductor device according to claim 6,
   wherein the insulating layer includes an oxide layer, a nitride layer, or an oxynitride layer of aluminum, hafnium, titanium, or silicon, or any arbitrary combination of the oxide layer, the nitride layer, or the oxynitride layer.

8. The compound semiconductor device according to claim 6,
   wherein a thickness of the insulating layer is 0.5 nm to 10 nm.

9. The compound semiconductor device according to claim 3, further comprising:
   a source electrode and a drain electrode that are disposed over the cap layer with the recess interposed between the source electrode and the drain electrode.

10. An amplifier comprising:
    a digital predistortion circuit configured to compensate for a nonlinear distortion of an input signal;
    a mixer configured to mix the input signal whose nonlinear distortion has been compensated for with an alternate current signal; and
    a power amplifier configured to amplify the input signal mixed with the alternate current signal, the power amplifier including
    a carrier supply layer,
    a channel layer disposed over the carrier supply layer and configured to include InGaAs, and
    an etching stopper layer disposed over the channel layer, and configured to include
    a first layer disposed over the channel layer and configured to include $In_{x1}Ga_{1-x1}P$, and
    a second layer disposed over the first layer and configured to include $In_{x2}Ga_{1-x2}P$,
    wherein x1 is greater than 0 and less than or equal to 1, x2 is greater than or equal to 0 and less than 1, and x1 is greater than x2.

11. A method for manufacturing a compound semiconductor device, the method comprising:
    forming a channel layer over a carrier supply layer, the channel layer including InGaAs; and
    forming an etching stopper layer over the channel layer, wherein the etching stopper layer includes
    a first layer disposed over the channel layer and configured to include $In_{x1}Ga_{1-x1}P$, and
    a second layer disposed over the first layer and configured to include $In_{x2}Ga_{1-x2}P$,
    wherein x1 is greater than 0 and less than or equal to 1, x2 is greater than or equal to 0 and less than 1, and x1 is greater than x2.

12. The method according to claim 11,
    wherein a difference in lattice constant between the first layer and the channel layer is smaller than a difference in lattice constant between the second layer and the channel layer.

13. The method according to claim 11, further comprising:
    forming a cap layer over the etching stopper layer;
    forming, in the cap layer, a recess that reaches the etching stopper layer; and
    performing steam treatment, at a temperature of 250° C. to 300° C., over a surface of the etching stopper layer exposed from the recess and forming an oxide layer that includes gallium oxide over the second layer inside the recess.

14. The method according to claim 13,
    wherein a thickness of the oxide layer is greater than or equal to 0.5 nm.

15. The method according to claim 13, further comprising:
    forming a gate electrode disposed over the oxide layer.

16. The method according to claim 15, further comprising:
   forming an insulating layer disposed between the oxide layer and the gate electrode.

17. The method according to claim 16,
   wherein the insulating layer includes an oxide layer, a nitride layer, or an oxynitride layer of aluminum, hafnium, titanium, or silicon, or any arbitrary combination of the oxide layer, the nitride layer, or the oxynitride layer.

18. The method according to claim 16,
   wherein a thickness of the insulating layer is 0.5 nm to 10 nm.

19. The method according to claim 13, further comprising:
   forming a source electrode and a drain electrode that are disposed over the cap layer with the recess interposed between the source electrode and the drain electrode.

* * * * *